United States Patent [19]

Fights et al.

[11] Patent Number: 4,555,416

[45] Date of Patent: Nov. 26, 1985

[54] SPRAY APPARATUS WITH SELF CLEANING NOZZLE

[75] Inventors: Michael L. Fights; William E. Jones, both of Muncie, Ind.

[73] Assignee: Ball Corporation, Muncie, Ind.

[21] Appl. No.: 644,490

[22] Filed: Aug. 27, 1984

[51] Int. Cl.⁴ .......................................... C23C 16/00
[52] U.S. Cl. .............................. 427/248.1; 427/421;
118/720; 118/715; 118/302; 239/112; 239/113;
239/424; 239/433
[58] Field of Search ............... 239/112, 113, 424, 433;
427/255, 421, 425, 248.1; 118/720, 715, 302,
326, DIG. 3

[56] References Cited

U.S. PATENT DOCUMENTS

| | | | |
|---|---|---|---|
| 2,692,800 | 10/1954 | Nichols et al. | 239/424 X |
| 3,452,714 | 7/1969 | Burke et al. | 118/322 X |
| 3,688,737 | 9/1972 | Augustsson et al. | 118/720 |
| 4,099,486 | 7/1978 | Bialorucki et al. | 118/322 X |
| 4,220,118 | 9/1980 | Levene et al. | 118/720 |
| 4,386,737 | 6/1983 | Antonov | 239/424 |

Primary Examiner—Shrive P. Beck
Attorney, Agent, or Firm—Gilbert E. Alberding

[57] ABSTRACT

Apparatus and method are provided for spraying a fluid through a first nozzle (48), and more particularly to spraying the vapor of a metallic compound onto glass containers (132), and for cleaning the first nozzle (48) without removing the first nozzle (48) and even without stopping the flow of the fluid being sprayed. The apparatus and method include providing a chamber (76) that is juxtaposed to the inlet (62) of the first nozzle (48), providing a second nozzle (52) whose outlet (68) is disposed inside the chamber (76), and spraying a fluid, preferably air, through the second nozzle (52), into the inlet (62) of the first nozzle (48), and through the first nozzle (48).

36 Claims, 10 Drawing Figures

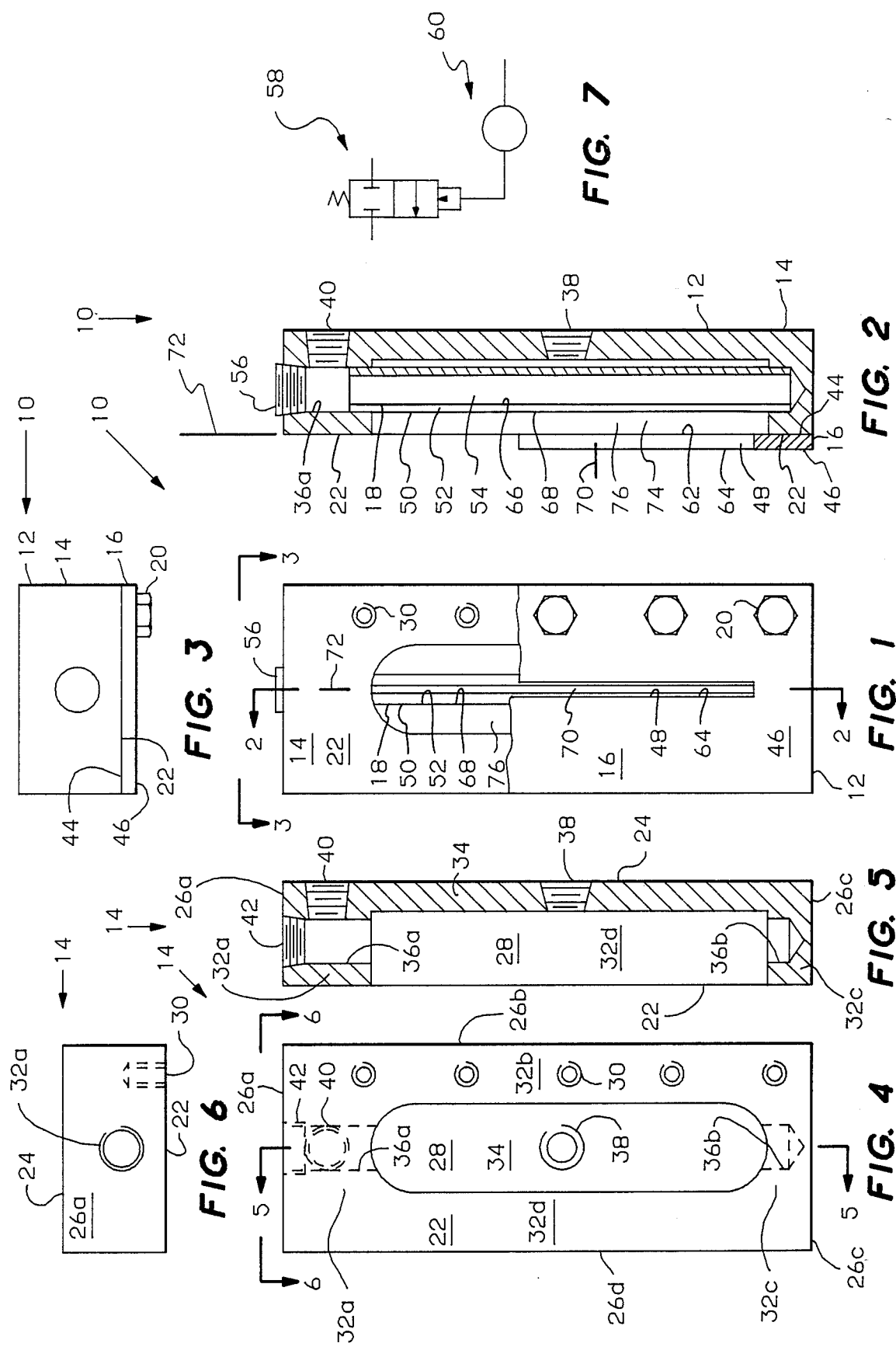

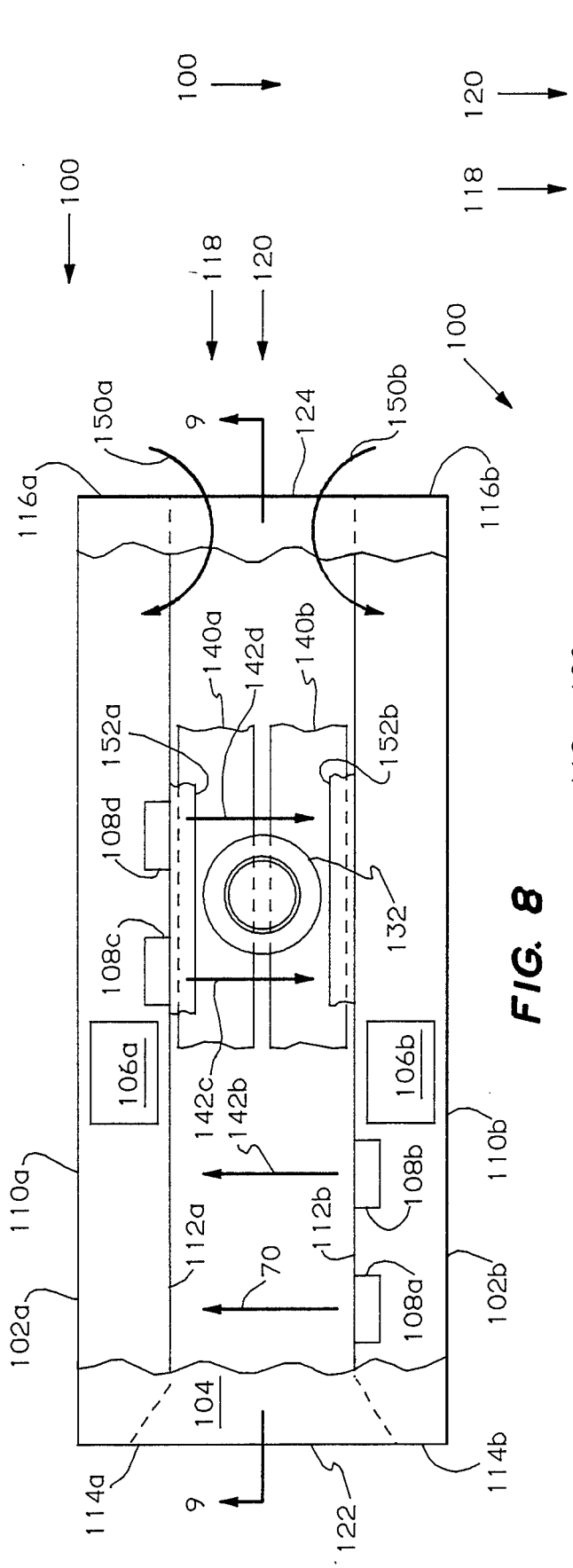
FIG. 8
FIG. 9
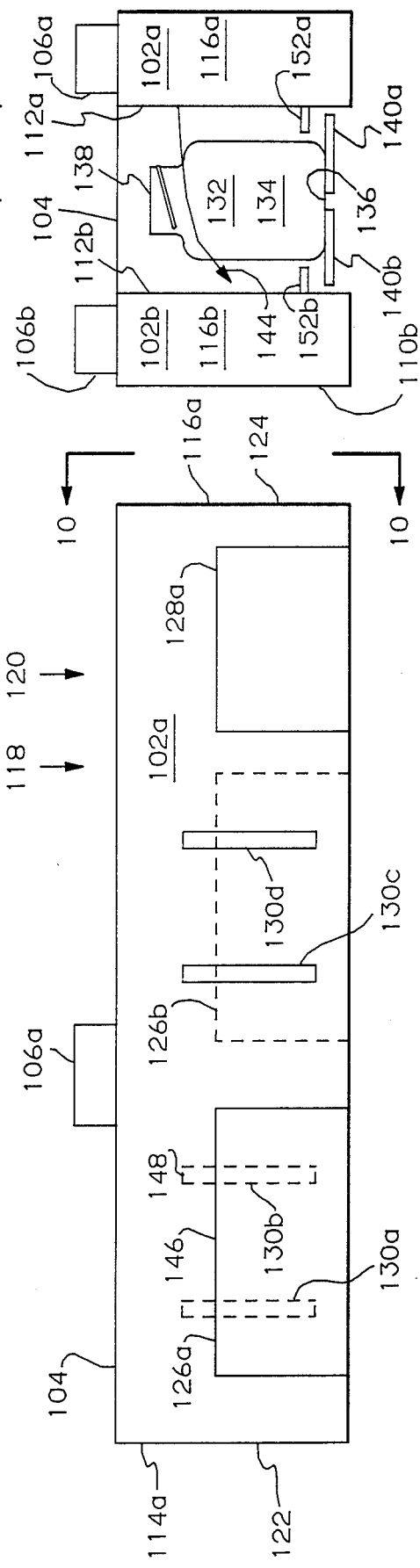
FIG. 10

SPRAY APPARATUS WITH SELF CLEANING NOZZLE

TECHNICAL FIELD

The present invention relates generally to apparatus for spraying a liquid or vapor, and a self cleaning device for cleaning the spray nozzle. More particularly, the present invention relates to apparatus for depositing a metallic oxide coating onto glassware by spraying a vapor of a metallic compound, and a self cleaning device for periodically cleaning build-up of material from the spray nozzle without disassembling the spray apparatus and even without stopping the flow of the vapor.

BACKGROUND ART

In the manufacture of glassware, it is common practice to apply two coatings to the outside surface of the glassware. One of these coatings is called a "hot-end" coating and the other is called a "cold-end" coating.

Hot-end coatings are applied to the glassware at the hot end of the annealing lehr. Hot-end coatings are used to provide increased chemical resistance, increased strength and durability, and increased resistance to scratches and abrasions.

Cold-end coatings are applied to the glassware after annealing and after the glassware has cooled from annealing temperatures. Cold-end coatings are used to provide a lubricating coating and thereby permit smooth flow of the containers through high speed inspection and filling lines.

Hot-end coatings consist of a metallic oxide which is applied as the vapor of a metallic compound. Common materials for use as hot-end coatings include titanium tetrachloride and tin tetrachloride.

When the metallic compound that has been deposited on the glassware is subjected to the pyrolyzing temperature of the compound, which is commonly above 315 degrees Celcius (600 degrees Farenheit), the metallic compound decomposes to form a thin metallic oxide coating that is permanently bonded to the surface of the glassware.

Since hot-end coatings are applied after removing the glassware from the molding machine, and prior to the glassware entering the annealing lehr, the temperature of the glassware is near 537 degrees Celcius (1000 degrees Farenheit), and thus far above the minimum pyrolyzing temperature; so no additional heat is required for the hot-end coating process.

While hot-end coatings impart desirable chemical and mechanical properties to glassware, it is important that they not be applied to the threaded portion of glass containers that use metal lids.

A metallic oxide coating on the threaded portion of the glass container increases the friction between the container and the metallic lid; and so accidentally depositing the coating on the threaded portion can result in an excessively high torque requirement for removal of the lid.

In addition, if a metallic oxide coating is applied to the threaded portion of glass containers, galvanic corrosion may occur between the metal lid and the metallic oxide coating in the presence of normal moisture in the air. The reason for this is the difference in electrical potentials between the metallic oxide coating and the metal of the lid or its electroplated coating.

Unfortunately, it is impossible during the application of the metallic vapor to see whether or not the vapor is being applied accidentally to the threaded portion of the glassware. Further, after pyrolyzing and cooling, it is often very difficult to determine without a chemical or optical test whether or not some of the threaded portion has received the metallic oxide coating.

Therefore, it is important to provide apparatus or process in which the vapor of the metallic compound is directed onto the glassware with accuracy; so that accidental coating of the threaded portion of the glass container is prevented.

One possible solution to the problem is to mechanically protect a portion of the glassware from receiving the vapor of the metallic compound. In U.S. Pat. No. 3,615,327, McLary disclosed apparatus for suspending glassware by the portion that is to be protected from the spray, and for carrying the glassware through the spray hood by the suspended portion.

However, because of the great variety of sizes of glass containers, both in diameter and height, automating a device such as has been disclosed by McLary is unduly complex and expensive.

DISCLOSURE OF INVENTION

In the present invention, apparatus is provided in which precise application of the vapor of a metallic compound to glass containers is achieved by controlling the shape of the jet of vapor, and by controlling movement of the vapor within the spray hood.

Further, the present invention provides a method for cleaning the spray nozzle without disassembling the spray head, and without discontinuing the flow of vapor through the spray nozzle.

Since it is not necessary to disassemble the spray head for cleaning, it is possible to automate the cleaning process; and such has been provided in the present invention.

Automated cleaning of the spray nozzle is important because metallic compounds build up periodically in the spray nozzle; and this build-up may cause a change in the shape of the spray jet. So, without automated cleaning of the spray nozzle, there is danger of periodically ruining a large quantity of the glassware due to depositing the metallic oxide coating onto the threaded portion of the containers, or otherwise affecting the distribution of coating thickness on the containers.

Thus, the present invention provides apparatus which achieves such accuracy in the control of the spray, even over a sustained length of time, that it is unnecessary to mechanically shield the threaded portion of the containers.

More particularly, the present invention provides a spray nozzle that is elongated vertically so that the vapor is discharged from the nozzle in an elongated and vertically disposed jet, the jet of vapor is pulled across the spray hood, and somewhat downward, by the design of the spray hood and by the exhaust air flow thereof, and problems in continued accuracy of the vertically disposed jet of vapor are obviated by automatic and periodic cleaning of the spray nozzle.

Cleaning of the spray nozzle is achieved by providing a chamber between the spray nozzle and a supply port that is juxtaposed to the inlet of the spray nozzle, providing a cleaning nozzle that opens into the chamber and that is oriented toward the inlet of the spray nozzle, and directing air though the cleaning nozzle and into the inlet of the spray nozzle.

BRIEF DESCRIPTION OF DRAWINGS

FIG. 1 is a front elevation of a spray head of the present invention, showing a portion of the cover plate thereof broken away;

FIG. 2 is a cross section of the spray head of FIG. 1, taken substantially as shown by section line 2—2 of FIG. 1, and showing a portion of the cover plate thereof broken away;

FIG. 3 is a top view of the spray head of FIGS. 1 and 2, taken substantially as shown by view line 3—3 of FIG. 1;

FIG. 4 is a front elevation of the body of the spray head of FIG. 1;

FIG. 5 is a cross section of the body of FIG. 4 taken substantially as shown by section line 5—5;

FIG. 6 is a top view of the body of FIGS. 4 and 5, taken substantially as shown by view line 6—6;

FIG. 7 is a schematic drawing of a solenoid operated valve and an electric timer for use with the spray head of FIGS. 1-3;

FIG. 8 is a top view of the spray apparatus that utilizes the spray head of FIGS. 1-3;

FIG. 9 is a cross section of the spray apparatus of FIG. 8, taken substantially as shown by section line 9—9 of FIG. 8; and FIG. 10 is an end view of the spray apparatus of FIGS. 8 and 9, taken substantially as shown by view line 10—10 of FIG. 9.

BEST MODE FOR CARRYING OUT THE INVENTION

Referring now to FIGS. 1-3, a spray head 10 includes a housing 12. The housing 12 includes a body 14, a cover plate 16 that serves as a first end wall or front wall, a slit tube 18, and cap screws 20.

Referring now to FIGS. 4-6, the body 14 includes a front surface 22, a back surface 24, side surfaces 26a-26d, a cavity 28 that is disposed intermediate of the front surface 22 and that extends inwardly therefrom, and threaded holes 30 that extend inwardly from the front surface 22.

The body 14 includes sidewalls 32a, 32b, 32c, and 32d that comprise the material that lies intermediate the cavity 28 and respective ones of the side surfaces 26a-26d, a back wall or second end wall 34 that lies intermediate of the cavity 28 and the back surface 24, a first cylindrically shaped opening 36a that extends inwardly from the side surface 26a, through the sidewall 32a, and into the cavity 28, and a second cylindrically shaped opening 36b that is coaxial with the first cylindrically shaped opening 36a and that extends from the cavity 28 into the sidewall 32c.

The body 14 includes a first supply port 38 that extends inwardly through the back wall 34 and into the cavity 28, and a second supply port 40 that extends inwardly from the back surface 24 and that intercepts the first cylindrically shaped opening 36a. The first cylindrically shaped opening 36a includes a threaded portion 42 that is proximal to the side surface 26a.

Referring again to FIGS. 1-3, the cover plate 16 includes an inside surface 44 and outside surface 46. The cover plate 16 is fixedly, sealingly, and removably attached to the body 14 with the inside surface 44 proximal to the front surface 22 of the body 14 by the cap screws 20.

The cover plate 16 includes an elongated opening 48 that extends through the cover plate 16 from the outside surface 46 to the inside surface 44.

The slit tube 18 includes an outer surface 50 that is cylindrically shaped except for a slit 52 that extends longitudinally along the tube 18 for its entire length; and the slit tube 18 includes a longitudinal opening 54.

The slit tube 18 is disposed in the cavity 28 and sealingly engages the first cylindrically shaped opening 36a and the second cylindrically shaped opening 36b.

Finally, the spray head 10 includes a plug 56 that is threaded into the threaded portion 42 of the first cylindrically shaped opening 36a.

In operation, a vapor of a metallic compound, such as titanium tetrachloride or tin tetrachloride, is supplied to the first supply port 38. The vapor enters into the cavity 28 and is sprayed out of the elongated opening 48 as an elongated and upstanding jet.

As the vapor of the metallic compound is sprayed through the elongated opening 48, some of this compound adheres to the cover plate 16; and this results in progressive blocking of the elongated opening 48.

If the elongated opening 48, which serves as a first nozzle, is not cleaned periodically, the particles that block the opening 48 will distort the jet pattern of the vapor which is being sprayed; and some of the metallic compound will be sprayed onto the threaded portions of the glassware.

However, in the present invention, a supply of air is connected to the second supply port 40 by means of a solenoid operated valve 58 and an electric timer 60. This supply of air is supplied to the second supply port 40 at predetermined intervals and for predetermined durations.

The air that is supplied to the second supply port 40 enters the first cylindrically shaped opening 36a, progresses into the longitudinal opening 54 of the slit tube 18, sprays out of the slit 52 of the tube 18, and then sprays through the elongated opening 48 of the cover plate 16 to clean the elongated opening 48.

It is not necessary to stop the flow of the vapor into the first supply port 38 during this cleaning process.

Referring again to FIGS. 1-3, the elongated opening 48 in the cover plate 16 serves as a first nozzle. This first nozzle or elongated opening 48 includes an inlet 62 which consists of the junction of the elongated opening 48 and the inside surface 44 of the cover plate 16, and an outlet 64 which consists of the junction of the elongated opening 48 and the outside surface 46 of the cover plate 16.

In like manner, the slit 52 in the tube 18 serves as a second nozzle. This second nozzle or slit 52 includes an inlet 66 which consists of the junction of the slit 52 and the longitudinal opening 54 of the tube 18, and an outlet 68 which consists of the junction of the slit 52 and the cylindrically shaped outer surface 50 of the tube 18.

Both the elongated opening 48 of the cover plate 16 and the slit 52 of the tube 18 are centered about an axis 70 which is disposed orthogonal to the outside surface 46 of the cover plate 16; the metallic compound is sprayed along the axis 70; and both the opening 48 and the slit 52 are elongated along an axis 72 that is disposed orthogonal to the axis 70 and that is disposed in the plane of the outside surface 46 of the cover plate 16.

The second nozzle, or slit, 52 is spaced apart from the first nozzle, or elongated opening, 48 by a space 74; and the outlet 68 of the slit, or second nozzle, 52 opens toward the inlet 62 of the elongated opening, or first nozzle, 48.

The cover plate 16, the body 14, and the cavity 28 cooperate to provide a chamber 76. Thus, the slit, or second nozzle, 52 includes an outlet 68 that is disposed in the chamber 76; and the inlet 62 of the first nozzle 48 is juxtaposed to the chamber 76.

Preferably, the width of the elongated opening or first nozzle 48 is 2,38 millimeters (0.0938 inches); and, preferably, the width of the slit or second nozzle 52 is 0,794 millimeters (0.03125 inches).

Referring now to FIGS. 8-10, a spray apparatus 100 includes a left duct housing 102a, a right duct housing 102b, a top 104 that extends between the duct housings 102a and 102b and that covers the duct housings 102a and 102b, a duct outlet 106a that is attached to the left duct housing 102a, a duct outlet 106b that is attached to the right duct housing 102b, and four spray heads 108a-108d.

The left duct housing 102a includes an outside wall 110a, a first or inside wall 112a, a first end wall 114a, and a second end wall 116a. The right duct housing 102b includes an outside wall 110b, a second wall or inside wall 112b, a first end wall 114b, and a second end wall 116b.

Or, dividing the various parts of the spray apparatus into different major components, the spray apparatus 100 includes a spray hood 118, exhaust means 120, and the spray heads 108a-108d.

The spray hood 118 includes the first wall 112a, the second wall 112b, the top 104, a first end opening 122, and a second end opening 124.

The exhaust means 120 includes the left duct housing 102a, the right duct housing 102b, the duct outlet 106a, the duct outlet 106b, and exhaust opening 126a which is disposed in the first wall 112a and which is depicted by solid lines in FIG. 9, and an exhaust opening 126b which is disposed in the second wall 112b and whose location relative to the second end opening 124 is depicted by phantom lines on the first wall 112a.

In addition, the exhaust means 120 includes a scavenging opening 128a in the first wall 112a, and a similarly sized and similarly located scavenging opening, not shown, in the second wall 112b.

Referring now to FIGS. 1-3 and 7-10, the spray heads 108a-108d are similar in construction to the spray heads 10 as previously described; except that the spray heads 108a-108d each include a portion of one of the walls, 112a or 112b, as their cover plates instead of having separate cover plates as do the spray heads 10.

Also, the first nozzle for each of the spray heads 108a-108d consists of an elongated opening 130a-130d in one of the walls, 112a or 112b. The elongated openings 130c and 130d in the first wall 112a are shown by solid lines in FIG. 9; the location of the elongated openings 130a and 130b in the second wall 112b are shown by phantom lines on the first wall 112a.

Referring again to FIGS. 7-10, in operation, a glass container 132 having a body portion 134, a bottom 136, and a threaded opening 138 is carried into the first end opening 122 of the spray hood 118 on a pair of spaced apart conveyor belts 140a and 140b.

The spray head 108a sprays the vapor of a metallic compound along the axis 70 from the second wall 112b toward the first wall 112a, the spray head 108b sprays the vapor from the second wall 112b toward the first wall 112a along a path 142b that is parallel to the axis 70. In like manner, the spray heads 108c and 108d spray the vapor from the first wall 112a toward the second wall 112b along paths 142c and 142d that are parallel to the axis 70.

The vapor is sprayed from the elongated openings or first nozzles 130a-130d in streams that are upstanding or vertically elongated as determined by the elongation of the first nozzles 130a-130d.

The flow of the vapor across the spray hood 118 is pictured by a stream line 144 in FIG. 10. It will be noticed that the stream line 144 bends downward as it approaches the second wall 112b. This downward bending of the stream line 144, which pictures downward bending of the jet of vapor, helps prevent the vapor from being deposited onto the threaded opening 138 of the container 132.

Downward bending of the jet of vapor is achieved by sizing the top 146 of the exhaust openings 126a and 126b lower than the top 148 of the elongated openings 130a-130d which serve as the first nozzles. Thus, as air is exhausted from the duct outlets 106a and 106b, and from the duct housings 102a and 102b, movement of air into the exhaust openings 126a and 126b causes the jet of vapor, as pictured by the stream line 144, to bend downward.

Scavenging air into the second end opening 124 of the spray hood 118, into the scavenging opening 128a, and into the left duct housing 102a is indicated by an arrow 150a; and scavenging of air into the second end opening 124, into a scavenging opening (not shown, same as the opening 128a), and into the right duct housing 102b is indicated by an arrow 150b.

Finally, the spray hood 118 includes guide rails 152a and 152b that are attached to respective ones of the walls 112a and 112b. As shown in FIG. 10 the guide rails 152a and 152b maintain the container 132 in a centered position between the walls 112a and 112b; so that the container 132 is supported and conveyed through the spray hood 118 by both of the conveyor belts, 140a and 140b.

By driving the conveyor belts, 140a and 140b, at different linear speeds, rotational movement, as well as movement through the spray hood 118, is achieved.

This rotational movement of the containers 132 cooperates with the upstanding jets of vapor, as determined by the elongated openings 130a-130d, to provide uniform coating of the vapor on the containers 132.

Further, the rotational movement of the containers 132, the upstanding jets of vapor, and the downward bending of the jets of vapor, as pictured by the stream line 144, achieves uniform coating of the vapor on the containers without accidentally spraying the vapor on the threaded openings 138 of the containers 132.

In summary, the present invention provides a spray head in which the spray nozzle can be cleared without removing the spray nozzle from the spray head, the spray nozzle can be cleaned without stopping the flow of fluid being sprayed, and a valve and timer are provided for automatically cleaning the spray nozzle at predetermined intervals.

In addition, the present invention provides a spray apparatus in which the spray vapor is deflected downward from a first axis along which the fluid is being sprayed, excess fluid is exhausted from the spray hood at a level that is lower than the level of the spray nozzle, and air and excess coating material are scavenged into the second end of the spray hood.

In the preceding description, the word "fluid" is used to differentiate between materials that will flow and that can be sprayed from materials that are solid. Thus, liquid that is vaporized at room temperature, liquids or solids that are vaporized by heat, gasses, and solids that are in the form of small particles that can be sprayed are included as fluids.

While specific apparatus and specific methods have been disclosed in the preceding description, these specific details have been given for the purpose of illustrating the present invention, and many variations thereof will become apparent to those versed in the art. Therefore, the scope of the present invention is to be determined by the appended claims.

Industrial Applicability

The present invention provides apparatus and method for cleaning the spray nozzle of any spray apparatus in which the spray nozzle requires periodic cleaning during or between spraying operations.

More particularly, the present invention is applicable to cleaning the spray nozzle of apparatus used for spraying hot-end coatings, such as vapors of metallic compounds, onto glassware, to cleaning the spray nozzle by directing air through a second nozzle and into the spray nozzle, and to automating the cleaning operation by use of a valve and a timer.

What is claimed is:

1. A method for spraying a first fluid through a first nozzle, and for cleaning said first nozzle without removing said first nozzle from a spray apparatus, which method comprises:
   (a) interposing a chamber between said first nozzle and a supply port;
   (b) inserting a second nozzle into said chamber;
   (c) supplying said first fluid to said supply port; and
   (d) directing a second fluid through said second nozzle, and through said first nozzle.

2. A method as claimed in claim 1 in which said directing step is performed at selected intervals.

3. A method as claimed in claim 1 in which said directing step is performed at selected intervals, and said supplying step is continued during said directing step.

4. A method for spraying a vapor of a metallic compound through a first nozzle, and for cleaning said first nozzle without removing said first nozzle from a spray apparatus, which method comprises:
   (a) interposing a chamber between said first nozzle and a supply port;
   (b) inserting a second nozzle inside said chamber;
   (c) supplying said vapor of said metallic compound to said supply port; and
   (d) directing a fluid through said second nozzle, and through said first nozzle.

5. A method as claimed in claim 4 in which said directing step is performed at selected intervals.

6. A method as claimed in claim 4 in which said directing step is performed at selected intervals, and said supplying step is continued during said directing step.

7. A method as claimed in claim 4 in which said fluid comprises a gas.

8. A method as claimed in claim 4 in which said fluid comprises air.

9. A method as claimed in claim 4 in which said directing step is performed at selected intervals; said supplying step is continued during said directing step; and said fluid comprises air.

10. A method as claimed in claim 4 in which said vapor is sprayed from the proximity of a first wall toward a second wall along a first axis; and
   said method comprises deflecting said vapor downward from said first axis as said vapor approaches said second wall.

11. A self-cleaning spray head which comprises:
   a housing having chamber therein, and having a first supply port that communicates with said chamber;
   first nozzle means being disposed along a first axis, being substantially centered about said first axis, being elongated along a second axis that is disposed substantially orthogonal to said first axis, having a first inlet that communicates with said chamber and that is substantially juxtaposed to said chamber, and having a first outlet that opens externally of said housing, for receiving a first fluid from said first supply port and said chamber, and for spraying said first fluid through said first nozzle means and generally along said first axis;

second nozzle means, being disposed substantially along said first axis, being substantially centered about said first axis, being elongated substantially along said second axis, having a second outlet that is disposed inside said chamber, that is spaced apart from said first inlet of said first nozzle means, and that opens toward said first outlet thereof, and having a second inlet, for receiving a second fluid into said second inlet, for spraying said second fluid through said second nozzle means, into said first inlet of said first nozzle means, and out through said first nozzle means, and for cleaning said first nozzle means with said second fluid.

12. A spray head for spraying generally along a first axis, which spray head comprises:

a housing having a chamber, having a first end wall that defines one side of said chamber, having a second end wall that defines the opposite side of said chamber, and having a first sidewall that defines a portion of said chamber intermediate of said first and second end walls;

first nozzle means, comprising a first elongated opening in said housing that extends through said first end wall and that is elongated along a second axis substantially orthogonal to said first axis, for spraying a first fluid generally along said first axis;

said first wall includes an inside surface and an outside surface;

said first nozzle means includes a first inlet that comprises the junction of said first opening with said inside surface and a first outlet that comprises the junction of said second opening and said outside surface;

second nozzle means, having a second outlet that is disposed inside said chamber, and having a second inlet, for receiving a second fluid into said second inlet, and for spraying said second fluid through said second nozzle means, into said first inlet of said first nozzle means, and out through said first nozzle means; and said second nozzle means comprises a second elongated opening that is elongated substantially along said second axis, and that opens toward said first elongated opening.

13. A spray head as claimed in claim 12 in which one of said walls of said housing is removably attached.

14. A spray head as claimed in claim 13 in which said one wall comprises said first end wall.

15. A spray head as claimed in claim 1 in which said housing includes a second opening that is disposed in a second one of said walls and that extends therethrough; and said disposing of said second outlet of said second nozzle means inside said chamber comprises said second opening.

16. A spray head as claimed in claim 15 in which said second one of said walls comprises said first sidewall.

17. A spray head as claimed in claim 16 in which said second nozzle means comprises a tube having an outer surface, having a longitudinal opening therein, and being disposed in said second opening of said first sidewall;

said second elongated opening comprises a slit in said tube that is longitudinally disposed, and that extends from said outer surface to said longitudinal opening;

said second inlet of said second nozzle means comprises the junction of said slit with said longitudinal opening; and said second outlet of said second nozzle means comprises the junction of said slit with said outer surface.

18. A spray head as claimed in claim 17 in which said second opening of said first sidewall comprises a first cylindrically shaped opening;

said housing includes a second sidewall that is disposed across said chamber from said first sidewall;

said second sidewall includes a second cylindrically shaped opening that is coaxial with said first cylindrically shaped opening, and that extends into said second sidewall from said chamber;

said outer surface of said tube comprises a cylindrically shaped outer surface;

said cylindrically shaped outer surface engages a portion of one of said cylindrically shaped openings; and said housing includes a second supply port that operatively communicates with said one cylindrically shaped opening, and with said longitudinal opening in said tube.

19. A spray head as claimed in claim 18 in which said housing comprises a body having a front surface, a back surface, and a first side surface;

said housing further comprises a cover plate, and means for removably and sealingly attaching said cover plate to said body;

said chamber comprises a cavity in said body that is disposed intermediate of said front surface and that extends inwardly therefrom;

said second end wall comprises the portion of said body that is disposed intermediate of said cavity and said back surface;

said first sidewall comprises the portion of said body that is disposed intermediate of said cavity and said first side surface; and said first end wall comprises said cover plate.

20. A self-cleaning spray apparatus which comprises:

a spray hood having a first wall, having a second wall that is spaced apart from said first wall, having a top that extends between said walls, having a first end opening that is disposed proximal to one of said walls, and having a second end opening that is disposed proximal to the other end of said walls;

first spray head means, being disposed proximal to said first wall, comprising a first nozzle that includes a first inlet and a first outlet, comprising a first chamber that is substantially juxtaposed against said first inlet of said first nozzle, and comprising a first supply port that communicates with said chamber, for delivering a first fluid from said first supply port to said chamber, for delivering said first fluid from said chamber to said first inlet of said nozzle, and for spraying said first fluid through said first nozzle and generally along a first axis that intercepts said second wall of said spray hood;

second nozzle means, comprising a second inlet, and comprising a second outlet that is disposed inside said chamber, for receiving a second fluid into said second inlet, for spraying said second fluid through said second nozzle means, into said first inlet of said first nozzle, and out through said first nozzle, and for cleaning said first nozzle with said second fluid; and exhaust means, being operatively attached to said spray hood, for drawing said first fluid toward said second wall, and for exhausting excess of said second fluid through said exhaust means.

21. A spray apparatus as claimed in claim 20 in which said first nozzle is disposed along said first axis and is substantially centered about said first axis;

said second nozzle means is disposed substantially along said first axis and is substantially centered about said first axis; and said second outlet of said second nozzle means opens toward said first inlet of said first nozzle and is spaced apart therefrom.

22. A spray apparatus as claimed in claim 20 in which said first nozzle is disposed along said first axis and is substantially centered abot said first axis;

said second nozzle means is disposed substantially along said first axis and is substantially centered about said first axis;

said first nozzle is elongated along a second axis that is disposed substantially orthogonal to said first axis;

said second nozzle means is elongated substantially along said second axis; and said second outlet of said second nozzle means is spaced apart from said first inlet of said first nozzle and opens toward said first inlet thereof.

23. A spray apparatus as claimed in claim 20 in which said apparatus includes deflecting means for deflecting said first sprayed fluid downward from said first axis as said first fluid approaches said second wall of said spray hood.

24. A spray apparatus as claimed in claim 23 in which said exhaust means includes scavenging means for scavenging air into one of said end openings of said spray hood.

25. A spray apparatus as claimed in claim 20 in which said apparatus includes means for transporting objects to be sprayed into said first end opening of said spray hood, through said spray hood, and out of said second end opening thereof.

26. A spray apparatus as claimed in claim 20 in which said apparatus includes means, comprising a valve, for selectively supplying said second fluid to said second nozzle means concurrent with supplying said first fluid to said first nzzle means.

27. A spray apparatus as claimed in claim 20 in which said apparatus includes means, comprising a timer, for supplying said second fluid to said second nozzle means at preselected intervals.

28. A spray apparatus which comprises a spray hood having a first wall, having a second wall that is spaced apart from said first wall, having a top that extends between said walls, having a first end opening that is disposed proximal to one end of said walls, and having a second end opening that is disposed proximal to the other end of said walls;

first spray head means, being disposed proximal to said first wall, comprising a first nozzle that includes a first inlet and a first outlet, comprising a first chamber that is substantially juxtaposed against said first inlet of said first nozzle, and comprising a first supply port that communicates with said chamber, for delivering a first fluid from said first supply port to said chamber, for delivering said first fluid from said chamber to said first inlet of said first nozzle, and for spraying said first fluid through said first nozzle along a first axis that intercepts said second wall of said spray hood;

second nozzle means, comprising a second inlet, and comprising a second outlet that is disposed inside said chamber, for receiving a second fluid into said second inlet, for spraying said second fluid through said second nozzle means, into said first inlet of said first nozzle, and out through said first nozzle;

exhaust means, being operatively attached to said spray hood, for drawing said first fluid toward said second wall, and for exhausting excess of said second fluid through said exhaust means;

said first spray head means comprises a housing having a first end wall that defines one side of said chamber, having a second end wall that defines the opposite side of said chamber, and having a first sidewall that defines a portion of said chamber intermediate of said first and second end walls;

said first nozzle comprises a first elongated opening in said housing that extends through said first end wall, that is disposed along said first axis, and that is elongated along a second axis substantially orthogonal to said first axis;

said first end wall includes an inside surface and an outside surface;

said first inlet of said first nozzle comprises the junction of said first elongated opening and said inside surface;

said first outlet of said first nozzle comprises the junction of said first elongated opening and said inside surface; and said second nozzle means comprises a second elongated opening that is spaced apart from said second axis, that is substantially parallel to said second axis, and that opens toward said first elongated opening.

29. A spray apparatus as claimed in claim 28 in which one of said walls of said housing is removably attached.

30. A spray apparatus as claimed in claim 28 in which said housing includes a second opening that is disposed in said first sidewall and extends therethrough; and said disposing of said second outlet of said second nozzle means inside said chamber comprises said second opening.

31. A spray apparatus as claimed in claim 30 in which said second nozzle means comprises a tube having an outer surface, having a longitudinal opening therein, and being disposed in said second opening of said first side wall;

said second elongated opening comprises a slit in said tube that is longitudinally disposed, and that extends from said outer surface to said longitudinal opening;

said second inlet of said second nozzle means comprises the junction of said slit with said longitudinal opening; and said second outlet of said second nozzle means comprises the junction of said slit with said outer surface.

32. A spray apparatus as claimed in claim 31 in which said second opening of said first sidewall comprises a first cylindrically shaped opening;

said housing includes a second sidewall that is disposed across said chamber from said first sidewall;

said second sidewall includes a second cylindrically shaped opening that is coaxial with said first cylindrically shaped opening, and that extends into said second sidewall from said chamber;

said outer surface of said tube comprises a cylindrically shaped outer surface;

said cylindrically shaped outer surface engages a portion of one of said cylindrically shaped openings; and said housing includes a second supply port that operatively communicates with said one cylindrically shaped opening, and with said longitudinal opening in said tube.

33. A spray apparatus as claimed in claim 30 in which said housing comprises a body having a front surface, a back surface, and a first side surface;

said housing further comprises a cover plate, and means for removably and sealingly attaching said cover plate to said body;

said chamber comprises a cavity in said body that is disposed intermediate of said front surface and that extends inwardly therefrom;

said second end wall comprises the portion of said body that is disposed intermediate of said cavity and said back surface;

said first sidewall comprises the portion of said body that is disposed intermediate of said cavity and said first side surface; and said first end wall comprises said cover plate.

34. A spray apparatus as claimed in claim 28 in which said exhaust means includes deflecting means for deflecting said first sprayed fluid downward from said first axis as said first fluid approaches said second wall of said spray hood; and said deflecting means comprises an opening in said second wall of said spray hood whose top is lower than the top of said elongation of said first nozzle.

35. A spray apparatus as claimed in claim 34 in which said exhaust means includes scavenging means, comprising a second opening in said second wall of said spray hood, for scavenging air into one of said end openings of said spray hood.

36. A spray apparatus as claimed in claim 28 in which said apparatus includes means for transporting objects to be sprayed into said first end opening of said spray hood, through said spray hood, and out of said second end opening thereof.

* * * * *